(12) United States Patent
Nakamori et al.

(10) Patent No.: US 7,859,315 B2
(45) Date of Patent: Dec. 28, 2010

(54) DRIVER CIRCUIT

(75) Inventors: Akira Nakamori, Matsumoto (JP);
Takahiro Mori, Matsumoto (JP);
Tomoyuki Yamazaki, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 46 days.

(21) Appl. No.: 12/330,110

(22) Filed: Dec. 8, 2008

(65) Prior Publication Data
US 2009/0146714 A1 Jun. 11, 2009

(30) Foreign Application Priority Data
Dec. 6, 2007 (JP) ............... 2007-316186

(51) Int. Cl.
*H03B 1/00* (2006.01)
(52) U.S. Cl. .............. 327/109; 327/108; 327/387; 327/388
(58) Field of Classification Search ......... 327/108–112, 327/379–381, 383–384, 387–388, 425, 432–434; 326/82–84, 89
See application file for complete search history.

(56) References Cited

U.S. PATENT DOCUMENTS

| | | | |
|---|---|---|---|
| 4,034,307 A | 7/1977 | Schade, Jr. | |
| 5,204,166 A | 4/1993 | Ito et al. | |
| 5,469,094 A * | 11/1995 | Nessi | 327/110 |
| 5,619,163 A | 4/1997 | Koo | |
| 6,208,185 B1 | 3/2001 | John et al. | |
| 6,459,324 B1 | 10/2002 | Neacsu et al. | |
| 7,151,401 B2 | 12/2006 | Inoue | |
| 2007/0247215 A1 | 10/2007 | Chen | |
| 2008/0094111 A1 | 4/2008 | Nakamori et al. | |

FOREIGN PATENT DOCUMENTS

| | | |
|---|---|---|
| JP | 2004-266368 A | 9/2004 |
| JP | 2004-280452 A | 10/2004 |
| JP | 2007-166655 A | 6/2007 |

\* cited by examiner

*Primary Examiner*—An T Luu
(74) *Attorney, Agent, or Firm*—Rossi, Kimms & McDowell LLP

(57) ABSTRACT

A driver circuit facilitates reducing noises and losses and improving the driving performances thereof without connecting a series circuit of capacitor and a resistor to the gate of IGBT. The driver circuit includes a slope setting circuit that sets the gate voltage waveform of IGBT; and an operational amplifier that includes a non-inverting input terminal, to which an output voltage V* from slope setting circuit is inputted, and an inverting input terminal, to which a divided voltage Vgsf divided by resistors is inputted; and the operational amplifier outputs an output voltage Vout, proportional to the difference between the output voltage V* and the divided voltage Vgsf, to the gate of IGBT.

15 Claims, 6 Drawing Sheets

DRIVER CIRCUIT

BACKGROUND

The present invention relates to a driver circuit. Specifically, the invention relates to a driver circuit that is preferably applicable for reducing the losses and noises of an insulated gate power device and for improving the driving performances thereof.

In semiconductor electric power converters, insulated gate power devices such as an insulated gate bipolar transistor (hereinafter referred to as an "IGBT") and a power MOSFET are used. Some conventional driver circuits for driving the insulated gate power devices are formed of an inverter.

FIG. 6, for example, is a circuit diagram briefly describing the structure of a conventional driver circuit. In FIG. 6, the conventional driver circuit includes P-channel field-effect transistor 41 and N-channel field-effect transistor 42 connected in series to each other. The source of P-channel field-effect transistor 41 is connected to a power supply voltage Vcc. The source of N-channel field-effect transistor 42 is connected to the ground potential. The drain of P-channel field-effect transistor 41 and the drain of N-channel field-effect transistor 42 are connected commonly to the gate of IGBT 43. A driving signal is fed commonly to the gate of P-channel field-effect transistor 41 and the gate of N-channel field-effect transistor 42. A signal that shifts between a low level and a high level may be used for the driving signal. The low level may be set at 0 V and the high level at the power supply voltage Vcc with no problem.

In order to turn on IGBT 43, the driving signal is set at a low level. As the driving signal is set at the low level, P-channel field-effect transistor 41 is turned on and N-channel field-effect transistor 42 is turned off. As transistor 41 is turned on and transistor 42 is turned off, the power supply voltage Vcc is applied to the gate of IGBT 43 via P-channel field-effect transistor 41. As the power supply voltage Vcc is applied to the gate of IGBT 43, a charging current flows to the gate of IGBT 43. As the charging current that flows to the gate of IGBT 43 raises the gate potential of IGBT 43, IGBT 43 is brought into a conductive state.

In order to turn off IGBT 43, the driving signal is set at the high level. As the driving signal is set at the high level, P-channel field-effect transistor 41 is turned off and N-channel field-effect transistor 42 is turned on. As transistor 41 is turned off and transistor 42 is turned on, the ground potential is applied to the gate of IGBT 43 via N-channel field-effect transistor 42. As the ground potential is applied to the gate of IGBT 43, electric charges are discharged from the gate of IGBT 43. As the electric charges are discharged from the gate of IGBT 43, the gate potential of IGBT 43 falls, thereby bringing IGBT 43 into a nonconductive state. In driving IGBT 43, the on-resistance of P-channel field-effect transistor 41 is used for turning on IGBT 43 and the on-resistance of N-channel field-effect transistor 42 is used for turning off IGBT 43, respectively.

U.S. Pat. No. 6,459,324 describes the prior art technique thereof disclosed by the U.S. Pat. No. 6,208,185. The prior art technique divides the turn-on period into an early stage I, a middle stage II and a late stage III. The gate of IGBT 43 is driven with adjusted driving capabilities in the stages I through III as described below to reduce the losses and noises caused in IGBT 43 and to improve the driving performances of the driver circuit.

Stage I: The gate of IGBT 43 is driven with a high driving capability (with a large output current from the driver circuit) to minimize the delay caused in the gate voltage rise.

Stage II: The gate of IGBT 43 is driven with a reduced driving capability to reduce the turn-on gradient (dIc/dt) of the drain current of IGBT 43 and to reduce the noises caused in IGBT 43.

Stage III: The gate of IGBT 43 is driven with a high driving capability to reduce the losses caused in IGBT 43.

However, in intelligent power modules (hereinafter referred to as "IPM's"), an insulated gate power device such as IGBT 43 and the driver circuit thereof are mounted on a same module. Usually, the insulated gate power device is guaranteed to operate at the maximum temperature of 150□. Therefore, when an insulated gate power device and the driver circuit thereof are mounted on the common module, the driver circuit positioned in the vicinity of the insulated gate power device is in a thermally severe environment. Moreover, the on-resistance of P-channel field-effect transistor 41 and the on-resistance of N-channel field-effect transistor 42 tend to be higher at a higher temperature higher than at the room temperature.

Due to the reasons described above, the gate of IGBT 43 is charged at a more reduced rate at a high temperature than at the room temperature by the driving scheme that drives IGBT 43 using the on-resistance of P-channel field-effect transistor 41 and the on-resistance of N-channel field-effect transistor 42 as shown in FIG. 6. As a result, a sharp voltage change (the change of the voltage between the collector and emitter of IGBT 43) is prevented from occurring and the noises caused by the voltage change are reduced. On the other hand, the period necessary for the turn-on of IGBT 43 is elongated and losses are increased. If the gate drive is designed optimally to minimize the losses caused at a high temperature, the gate of IGBT 43 will be charged too fast at the room temperature, a sharp voltage change will be caused, and noises will be increased.

In the scheme described in FIG. 6, a tradeoff exists between the noises and losses. Therefore, it is necessary to analyze the noises and losses at the room temperature and at a high temperature and to design a gate drive based on the analyses at the room temperature and at the high temperature. Therefore, many man-hours are necessary for the gate drive design.

For adjusting the driving capability in the turn-on stages I through III by the method disclosed in U.S. Pat. No. 6,459, 324, it is necessary to connect a series circuit of a capacitor and a resistor to the gate of IGBT 43 driven by a driver circuit. Therefore, the number of component parts and the substrate area are increased, further causing manufacturing cost increase.

In view of the forgoing, it would be desirable to provide a driver circuit that makes it possible to reduce the losses and noises of a power device and to improve the driving performances thereof without connecting a series circuit, including a capacitor and a resistor, to the gate of the power device thereof.

SUMMARY OF THE INVENTION

The present invention provides a driver circuit for obviating the problems described above. In a preferred embodiment, the driver circuit included a slope setting circuit setting the gate voltage waveform of an insulated gate device, and an operational amplifier driving the gate of the insulated gate device based on the difference between the detected gate voltage value of the insulated gate device and the set value of the gate voltage set by the slope setting circuit.

The driver circuit, which adjusts the gate voltage waveform outputted from the slope setting circuit as described above, makes it possible to adjust the gate voltage waveform of the insulated gate device and to drive the gate of the insulated gate device with a high driving capability or with a reduced driving capability in the respective stages of the turn-on. Therefore, the driver circuit according to the invention facilitates reducing the losses and noises caused by driving the insulated gate device and improving the driving performances thereof without connecting a series circuit of a resistor and a capacitor to the gate of the insulated gate device. In addition, the driver circuit according to the invention facilitates reducing the number of the component parts, preventing the substrate area from being widened and reducing the manufacturing costs thereof.

The invention further provides a driver circuit including a constant current supply generating a constant current, a changeover circuit connecting the gate of an insulated gate device in the turn-on thereof to the power supply potential side via the constant current supply, the changeover circuit connecting the gate of the insulated gate device in the turn-off thereof to the ground potential side, a slope setting circuit setting the gate voltage waveform of the insulated gate device, and an operational amplifier driving the gate of the insulated gate device based on the difference between the detected gate voltage value of the insulated gate device and the set value of the gate voltage set by the slope setting circuit.

The driver circuit makes it possible to adjust the gate voltage waveform of the insulated gate device and to turn on the insulated gate device via a constant current supply. Therefore, the driver circuit makes it possible to reduce the temperature dependence of the charging rate, at which the gate of the insulated gate device is charged, and to raise or lower the driving capability thereof in the respective stages of the turn-on. As a result, noises and losses are prevented from causing in room-temperature turn-on as well as in high-temperature turn-on and the driving performances of the driver circuit are improved. Therefore, it becomes possible to prevent the number of the component parts from increasing and to reduce the man-hour for designing a driver circuit that considers loss reduction, noise reduction and improved gate driving performances.

According to a further embodiment, in the driver circuit described above, the changeover circuit connects the gate of the insulated gate device to the power supply potential side based on a trigger input, and the slope setting circuit generates the gate voltage waveform of the insulated gate device based on the trigger input.

The configuration described above makes it possible to turn on the insulated gate device via the constant current supply based on a trigger input. The configuration described above also makes it also possible to adjust the driving capability in the respective stage of the turn-on. Therefore, the configuration described above makes it possible to reduce the losses and noises and to improve the driving performances of the driver circuit, even when the gate capacitance of the insulated gate device is large.

The constant current supply described above preferably includes a first transistor, to the drain side thereof a resistor is connected, a second transistor constituting a current mirror together with the first transistor, the second transistor generating the constant current determined by the resistance value of the resistor and a reference voltage, and a third transistor constituting a current mirror together with the second transistor, the third transistor including a drain connected to the gate of the insulated gate device.

The configuration described above makes it possible to amplify the constant current determined by the resistance value and the reference voltage in turning on the insulated gate device. Therefore, the configuration described above makes it possible to prevent noises and losses from causing in room-temperature turn-on as well as in high-temperature turn-on.

The driver circuit described above preferably further includes a fourth transistor connected in series to the second transistor, and a fifth transistor switching the fourth transistor for making a current flow through the resistor.

The configuration described above facilitates making a current flow into or out of the gate of the insulated gate device via the constant current supply in the turn-on of the insulated gate device.

The driver circuit preferably sets the upper limit value of an output voltage from the slope setting circuit based on a value proportional to the power supply voltage of the driver circuit.

The configuration described above makes it possible to change the upper limit value of the output voltage from the slope setting circuit even when the power supply voltage of the driver circuit changes. Therefore, it is possible to adjust the gate voltage waveform of the insulated gate device arbitrarily.

Preferably, the voltage having the gate voltage waveform set by the slope setting circuit increases exponentially in the driver circuit described in any of the above-described embodiments.

The configuration described above makes it possible to raise the driving capability in the early stage of turn-on and to minimize the delay caused in the voltage rise. The scheme described above makes it possible to reduce the driving capability in the middle stage of the turn-on, to reduce the rising gradient of the drain current of the insulated gate device and to reduce the noises of the insulated gate device. The scheme described above makes it also possible to raise the driving capability in the late stage of the turn-on and to reduce the losses of the insulated gate device. As a result, the number of the component parts is prevented from increasing, the noises and losses of the insulated gate device are reduced and the driving performances of the driver circuit are improved.

The slope setting circuit preferably includes a constant current supply generating a constant current, a current mirror circuit generating a current proportional to the current generated by the constant current supply, a series circuit including a resistor and a capacitor, the series circuit being connected to the output terminal of the slope setting circuit, and a switching device triggered by the trigger input for making the current generated by the current mirror circuit flow to the series circuit.

The configuration described above makes it possible to increase the output voltage from the slope setting circuit at the time constant determined by the resistance of the resistor and the capacitance of the capacitor and to increase the set gate voltage value set in the slope setting circuit exponentially.

Still further, the voltage having the gate voltage waveform set by the slope setting circuit increases linearly in the driver circuit described in any of the above embodiments.

The configuration described above makes it possible to raise the driving capability in the early stage of turn-on and to minimize the delay caused in the voltage rise. The scheme described above makes it possible to reduce the driving capability in the middle stage of the turn-on, to reduce the rising gradient of the drain current of the insulated gate device and to reduce the noises of the insulated gate device. The scheme described above makes it possible to raise the driving capability in the late stage of the turn-on and to reduce the losses of the insulated gate device. As a result, the number of the component parts is prevented from increasing, the noises and losses of the insulated gate device are reduced and the driving performances of the driver circuit are improved.

The slope setting circuit preferably includes a constant current supply generating a constant current, a current mirror circuit generating a current proportional to the current generated by the constant current supply, a capacitor connected to the output terminal of the slope setting circuit, and a switching device triggered by the trigger input for making the current generated by the current mirror circuit flow to the capacitor.

The configuration makes it possible to increase the output voltage from the slope setting circuit based on the charge quantity accumulated in the capacitor. Therefore, it is possible to increase the set value of the gate voltage set by the slope setting circuit linearly.

The slope setting circuit preferably includes a first voltage waveform setting section making the set value of the gate voltage waveform of the insulate gate device increase exponentially, a second voltage waveform setting section making the set value of the gate voltage waveform of the insulate gate device increase linearly, and a voltage waveform selecting section selectively outputting any of the gate voltage waveform set by the first voltage waveform setting section and the gate voltage waveform set by the second voltage waveform setting section.

The driver circuit described above makes it possible to select the gate voltage waveform of the insulated gate device and to optimize the gate voltage waveform of the insulated gate device even when variations are caused in the characteristics of the insulated gate device.

The driver circuit according to the invention makes it possible to reduce losses and noises and to improve the driving performances thereof without using a series circuit of a capacitor and a resistor connected to the gate of the insulate gate device. The driver circuit according to the invention makes it possible to reduce the number of the component parts, to prevent the substrate area from being widened, and to reduce the manufacturing costs thereof.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

Figure 1:
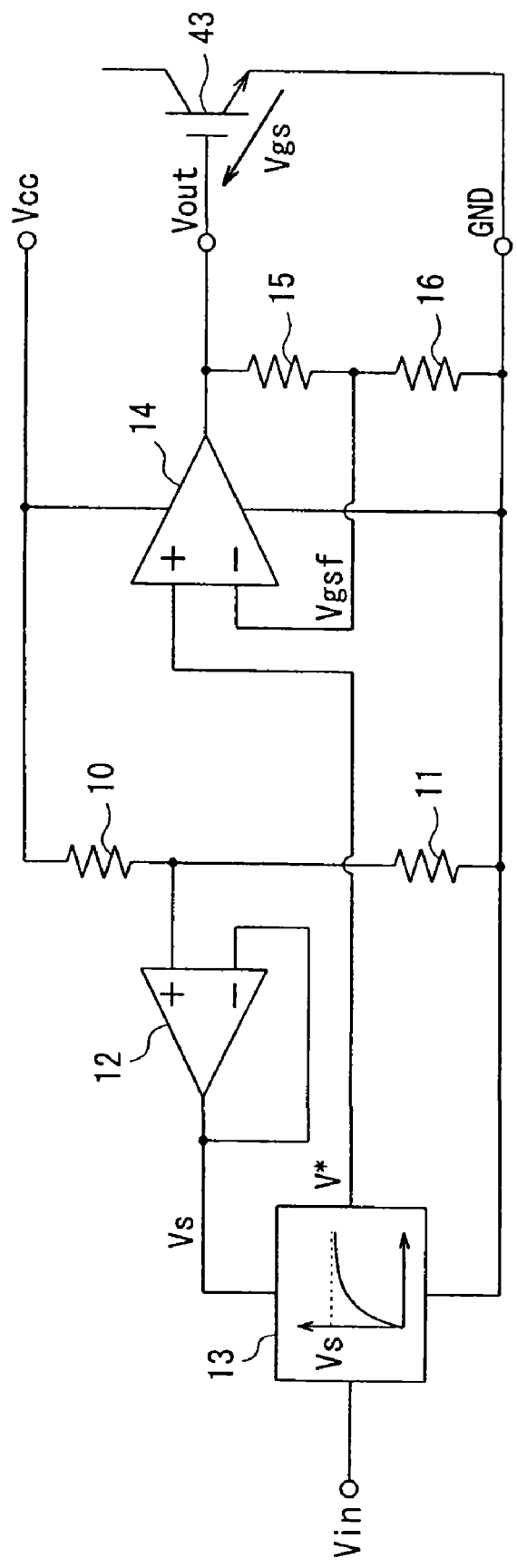
FIG. 1 is a block circuit diagram describing the configuration of a driver circuit according to a first embodiment of the invention.

FIG. 1 is a block circuit diagram describing the configuration of a driver circuit according to a first embodiment of the invention. As shown in FIG. 1, a driver circuit according to a first embodiment includes slope setting circuit 13 that sets the gate voltage waveform of IGBT 43. Slope setting circuit 13 is triggered by a trigger input to output a gate voltage waveform, on which the gate voltage increases exponentially or linearly.

The power supply terminal of slope setting circuit 13 is connected to the output terminal of operational amplifier 12. The ground terminal of slope setting circuit 13 is connected to the ground potential GND. The output terminal of slope setting circuit 13 is connected to the non-inverting input terminal of operational amplifier 14.

Resistor 10 and resistor 11 are connected in series to each other between the power supply voltage Vcc of the driver circuit and the ground potential GND. The non-inverting input terminal of operational amplifier 12 is connected to the connection point of resistors 10 and 11. The inverting input terminal of operational amplifier 12 is connected to the output terminal thereof such that a voltage follower is configured.

Resistor 15 and resistor 16 are connected in series to each other between the gate terminal of IGBT 43 and the ground potential GND. The non-inverting input terminal of operational amplifier 14 is connected to the output terminal of slope setting circuit 13. The inverting input terminal of operational amplifier 14 is connected to the connection point of resistors 15 and 16. The output terminal of operational amplifier 14 is connected to the gate terminal of IGBT 43. The power supply terminal of operational amplifier 14 is connected to the power supply potential Vcc of the driver circuit. The ground terminal of operational amplifier 14 is connected to the ground potential GND.

The power supply voltage Vcc of the driver circuit is divided by resistors 10 and 11. The divided voltage divided by resistors 10 and 11 is fed to the non-inverting input terminal of operational amplifier 12. As the divided voltage is inputted to the non-inverting input terminal of operational amplifier 12, a power supply voltage $V_S$ proportional to the divided voltage is outputted from operational amplifier 12 to the power supply terminal of slope setting circuit 13.

The divided voltage divided by resistors 10 and 11 is inputted to the power supply terminal of slope setting circuit 13 via operational amplifier 12. By inputting the divided voltage as described above, it becomes possible to change the upper limit value of the output voltage V* from slope setting circuit 13 in proportion to the power supply voltage Vcc of the driver circuit, even when the power supply voltage Vcc changes. Therefore, the gate voltage waveform of IGBT 43 can be adjusted arbitrarily.

As an input voltage Vin is inputted to the input terminal of slope setting circuit 13, the output voltage V* from slope setting circuit 13 rises from 0 V to the power supply voltage $V_S$ of slope setting circuit 13 so that a predetermined gate voltage waveform may be obtained. The output voltage V* from slope setting circuit 13 is inputted to the non-inverting input terminal of operational amplifier 14. A rectangular signal that changes from a low level (e.g. 0 V) to a high level (e.g. 5 V) may be used for the input voltage Vin. The time point, at which the input voltage Vin changes the level thereof from low one to high one, may be used for a trigger input to slope setting circuit 13.

A voltage Vgs between the gate and source of IGBT 43 is divided by resistors 15 and 16. A divided voltage Vgsf obtained by dividing the voltage Vgs by resistors 15 and 16 is inputted to the inverting input terminal of operational amplifier 14. As the divided voltage Vgsf is inputted to the inverting input terminal of operational amplifier 14, an output voltage Vout proportional to the difference between the output voltage V* from slope setting circuit 13 and the divided voltage Vgsf is outputted from operational amplifier 14 to the gate terminal of IGBT 43.

The resistance values of resistors 10, 11, 15 and 16, represented respectively by R10, R11, R15 and R16, are set such that the following relational expression holds.

$$R10/R11 = R15/R16$$

Therefore, the waveform of the output voltage V* from slope setting circuit 13 and the waveform of the voltage Vgs between the gate and source of IGBT 43 are similar to each other. As the output voltage V* from slope setting circuit 13 rises, IGBT 43 is turned on, a charging current flows to the gate of IGBT 43, and the gate potential of IGBT 43 rises, bringing IGBT 43 into a conductive state.

Due to the scheme described above, it is possible to adjust the gate voltage waveform of IGBT 43 by adjusting the gate voltage waveform outputted from slope setting circuit 13. As a result, by dividing the turn-on period into the early stage I, the middle stage II and the late stage III, it becomes possible to raise and lower the driving capability of the driver circuit in the stages I through III. As described above, it becomes possible to reduce losses and noises and to improve the driving performances without connecting a series circuit of a capacitor and a resistor to the gate of IGBT 43. Thus, it becomes possible to reduce the number of component parts, to prevent the substrate area from being widened, and to reduce the manufacturing costs of the driver circuit.

Figure 2:
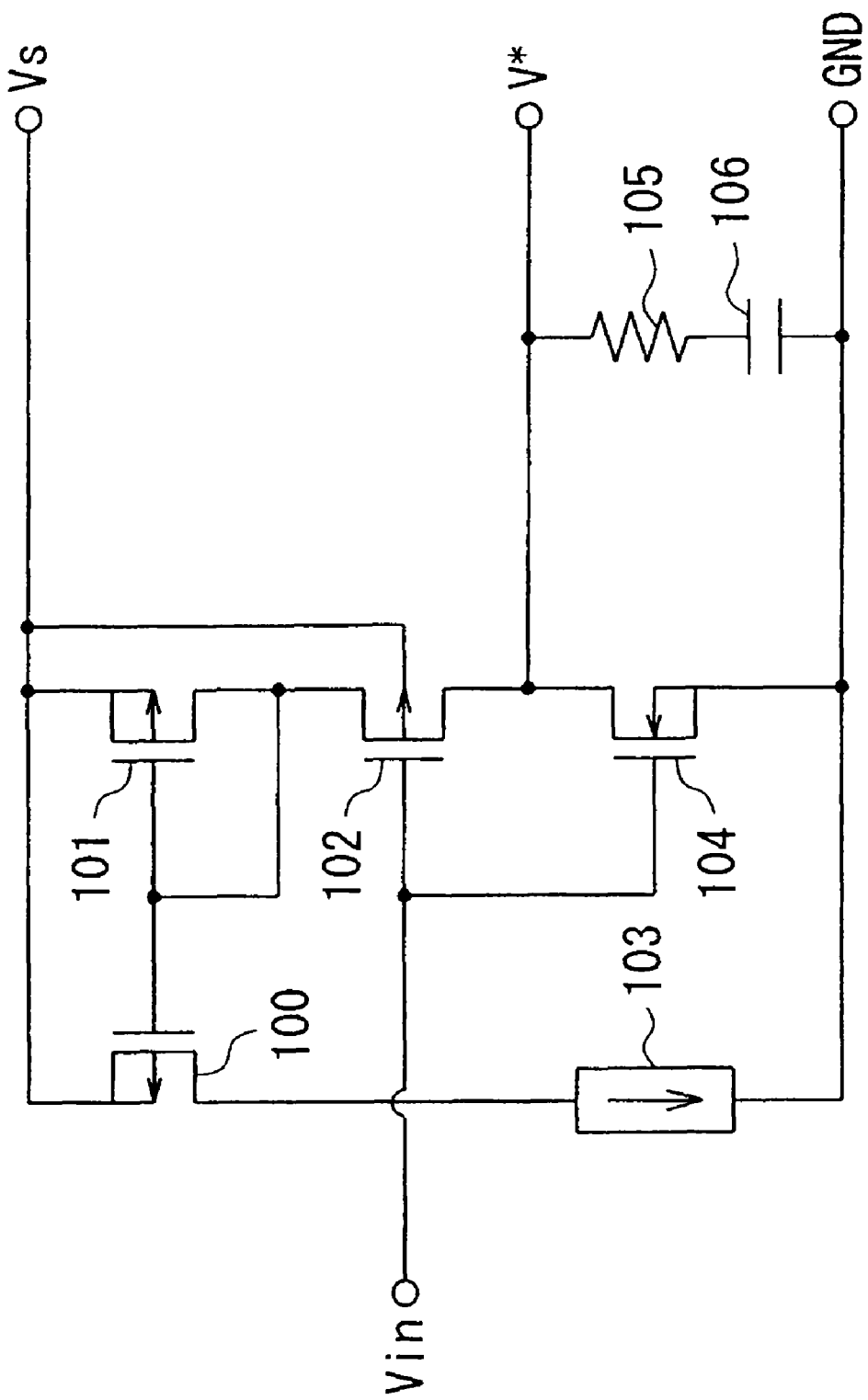
FIG. 2 is a circuit diagram briefly describing the configuration of the slope setting circuit shown in FIG. 1.

FIG. 2 is a circuit diagram briefly describing the configuration of the slope setting circuit shown in FIG. 1. In FIG. 2, P-channel field-effect transistor 101, P-channel field-effect transistor 102, and N-channel field-effect transistor 104 are connected in series to each other. P-channel field-effect transistors 100 and 101 are connected in parallel to each other. The gates of P-channel field-effect transistors 100 and 101 are connected commonly to the drain of P-channel field-effect transistor 101, constituting a current mirror.

Constant current supply 103 is connected in series to the drain of P-channel field-effect transistor 100. The gates of P-channel field-effect transistor 102 and N-channel field-effect transistor 104 are commonly connected constituting an inverter. A series circuit of resistor 105 and capacitor 106 is connected in parallel to N-channel field-effect transistor 104.

The power supply voltage $V_S$ outputted from operational amplifier 12 shown in FIG. 1 is applied to the sources of P-channel field-effect transistors 100 and 101. The input voltage Vin is inputted to the gate of P-channel field-effect transistor 102 and to the gate of N-channel field-effect transistor 104. As the input voltage Vin changes the level thereof from high one to low one, N-channel field-effect transistor 104 is turned off and P-channel field-effect transistor 102 is turned on. As P-channel field-effect transistor 102 is turned on, a current proportional to the current flowing through constant current supply 103 flows through P-channel field-effect transistor 102 due to the current mirror operation conducted by P-channel field-effect transistors 100 and 101. The current flowing through P-channel field-effect transistor 102 flows to the series circuit of resistor 105 and capacitor 106, charging capacitor 106 at the time constant determined by the resistance of resistor 105 and the capacitance of capacitor 106. As capacitor 106 is charged as described above, the output voltage V* from slope setting circuit 13 rises exponentially from 0 V to the power supply voltage $V_S$.

Figure 3:
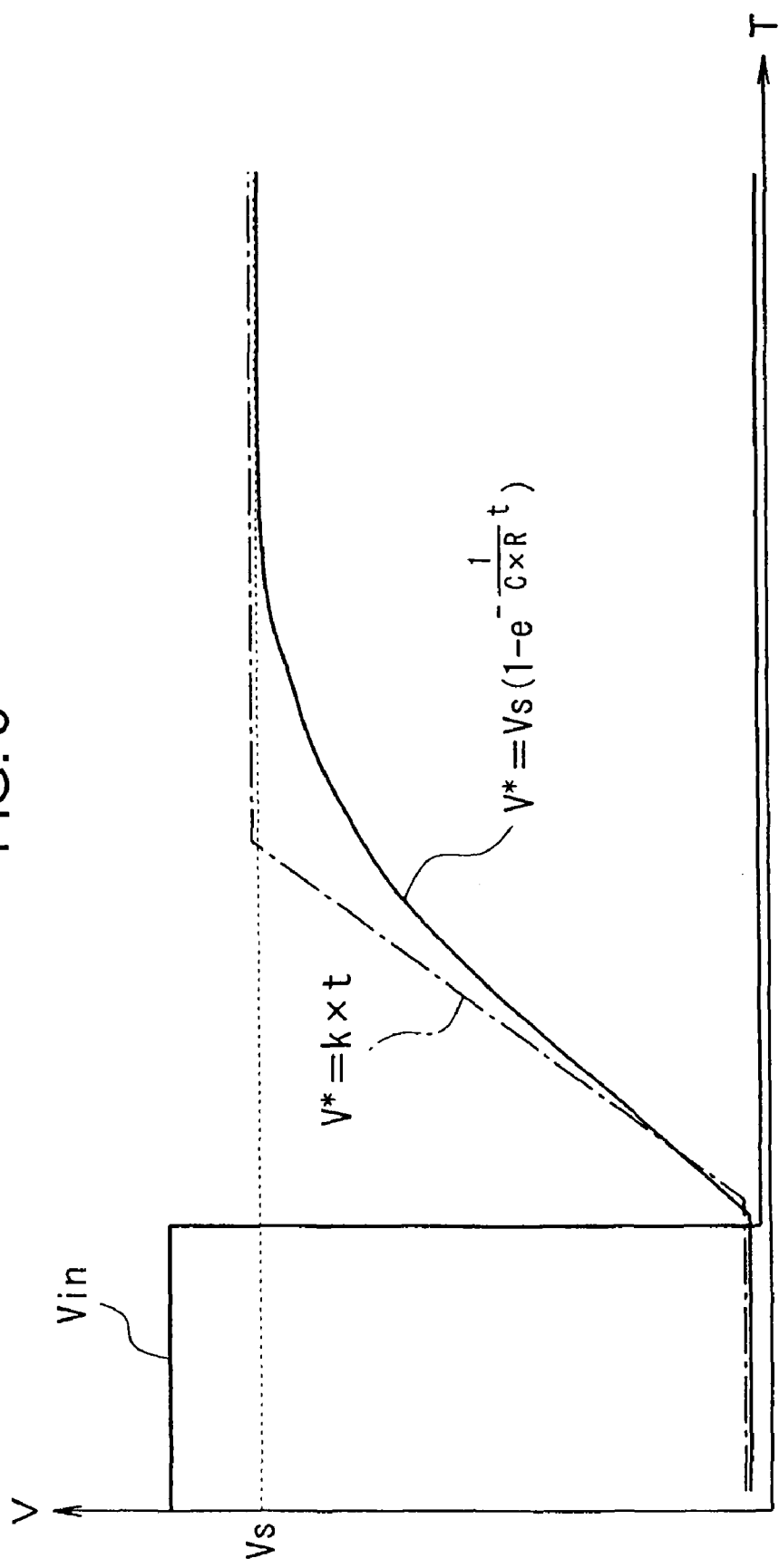
FIG. 3 is a wave chart describing the waveforms of input and output responses to and from the slope setting circuit shown in FIG. 2.

FIG. 3 is a wave chart describing the waveforms of input and output responses to and from the slope setting circuit shown in FIG. 2. In FIG. 3, the resistance of resistor 105 and the capacitance of capacitor 106 are represented by R and C, respectively. The output voltage V* from slope setting circuit 13 shown in FIG. 2 rises exponentially as described by the following formula.

$$V^* = V_S(1 - e^{-t/(CR)})$$

By omitting resistor 105 shown in FIG. 2, the output voltage V* from slope setting circuit 13 shown in FIG. 1 is made to increase linearly.

$$V^* = kt$$

wherein, k is a constant.

By raising the output voltage V* from slope setting circuit 13 exponentially, the gate of IGBT 43 is charged with a large charging current in the early stage of the turn-on period and a delay time caused in the gate voltage rise of IGBT 43 is minimized. In the middle stage of the turn-on period, the gate of IGBT 43 is charged with a small charging current, the turn-on gradient of the drain current of IGBT 43 is made to be small, and the noises caused in IGBT 43 are reduced. The gate of IGBT 43 is charged with a large charging current in the late stage of the turn-on period and the losses caused in IGBT 43 are reduced. As a result, the component parts are prevented from increasing, the losses and noises caused by IGBT 43 are reduced, and the driving performances of the driver circuit are improved.

Figure 4:
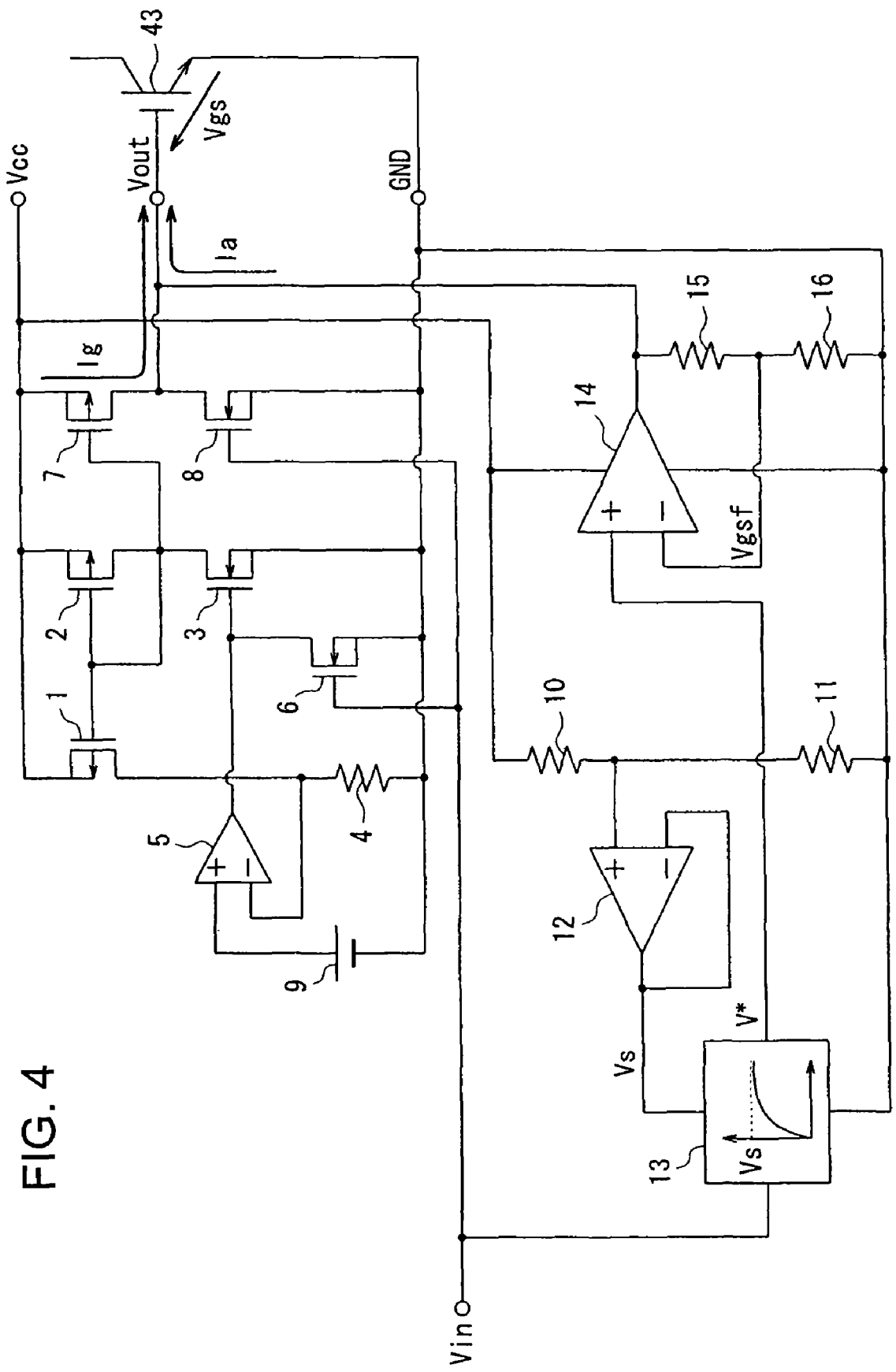
FIG. 4 is a block circuit diagram describing the configuration of a driver circuit according to a second embodiment of the invention.

FIG. 4 is a block circuit diagram describing the configuration of a driver circuit according to a second embodiment of the invention. In FIG. 4, P-channel field-effect transistor 2 and N-channel field-effect transistor 3 are connected in series to each other. P-channel field-effect transistors 1 and 2 are connected in parallel to each other. The gates of P-channel field-effect transistors 1 and 2 are connected commonly to the drain of P-channel field-effect transistor 2, constituting a current mirror.

Resistor 4 is connected in series to the drain of P-channel field-effect transistor 1. The non-inverting input terminal of operational amplifier 5 is connected to power supply 9. The inverting input terminal of operational amplifier 5 is connected to the drain of P-channel field-effect transistor 1. The output terminal of operational amplifier 5 is connected to the gate and drain of N-channel field-effect transistor 3.

P-channel field-effect transistor 7 and N-channel field-effect transistor 8 are connected in series to each other. The gate of N-channel field-effect transistor 8 is connected to the gate of P-channel field-effect transistor 6. The gate of P-channel field-effect transistor 7 is connected to the connection point of P-channel field-effect transistor 2 and N-channel field-effect transistor 3. The connection point of P-channel field-effect transistor 7 and N-channel field-effect transistor 8 is connected to the gate of IGBT 43.

In the driver circuit shown in FIG. 4, the driver circuit shown in FIG. 1 is disposed. The non-inverting input terminal of operational amplifier 12 is connected to the source of P-channel field-effect transistor 7 via resistor 10. The output terminal of operational amplifier 14 is connected to the connection point of P-channel field-effect transistor 7 and N-channel field-effect transistor 8. The gate of P-channel field-effect transistor 6 and the gate of N-channel field-effect transistor 8 are connected to the input terminal of slope setting circuit 13.

As the input voltage Vin changes the level thereof from high one to low one, N-channel field-effect transistors 6 and 8 are turned off. Operational amplifier 5 adjusts the gate voltage of N-channel field-effect transistor 3 so that the voltage drop across resistor 4 may be equal to the voltage V0 of power supply 9. As a current flows through N-channel field-effect transistor 3, the current flows also through P-channel field-effect transistor 2. By the current mirror operation conducted by P-channel field-effect transistors 1 and 2, a current, proportional to the current flowing through P-channel field-effect transistor 2, flows through P-channel field-effect transistor 1 via resistor 4.

If the resistance of resistor 4 is represented by R4, a constant current of V0/R4 flows through P-channel field-effect transistor 1 and resistor 4. A current proportional to V0/R4 flows through P-channel field-effect transistor 2 and N-channel field-effect transistor 3. As the current proportional to V0/R4 flows through P-channel field-effect transistor 2, a constant current Ig proportional to V0/R4 flows through P-channel field-effect transistor 7 to the gate of IGBT 43 by the current mirror operation conducted by P-channel field-effect transistors 2 and 7.

As the input voltage Vin changes the level thereof from high one to low one, the output voltage V* from slope setting circuit 13 rises exponentially from 0 V to the power supply voltage $V_S$ of slope setting circuit 13. The output voltage V* from slope setting circuit 13 is inputted to the non-inverting input terminal of operational amplifier 14. The voltage Vgs between the gate and source of IGBT 43 is divided by resistors 15 and 16. The divide voltage Vgsf obtained by dividing the voltage Vgs by resistors 15 and 16 is inputted to the inverting input terminal of operational amplifier 14. As the divided voltage Vgsf is inputted to the inverting input terminal of operational amplifier 14, a voltage proportional to the difference between the output voltage V* and the divided voltage Vgsf is outputted from operational amplifier 14 and a charging current Ia flows to the gate of IGBT 43.

The scheme described above makes it possible to adjust the gate voltage waveform of IGBT 43 and to turn on IGBT 43 via a constant current supply. Due to this, it is possible to reduce the temperature dependence of the charging rate, at which the gate of IGBT 43 is charged, even when the gate capacitance of IGBT 43 is large. It is also possible to charge the gate of IGBT 43 with a large charging current at a high rate or with a small charging current at a reduced rate in the respective stages of turn-on. As a result, it becomes possible to reduce the noises and losses in the room temperature turn-on was well as in the high temperature turn-on and to improve the driving performances of the driver circuit. Therefore, it becomes possible to prevent the number of the component parts from increasing and to reduce the man-hour for designing a driver circuit that considers loss reduction, noise reduction and improved gate driving performances.

As the input voltage Vin changes the level thereof from low one to high one, N-channel field-effect transistors 6 and 8 are turned on. As N-channel field-effect transistor 6 is turned on, the gate voltage of N-channel field-effect transistor 3 shifts to the low level, turning off N-channel field-effect transistor 3. As N-channel field-effect transistor 3 is turned off, the current that flows through P-channel field-effect transistor 2 becomes 0. Due to the current mirror operation of P-channel field-effect transistors 2 and 7, the current that flows through P-channel field-effect transistor 7 becomes 0. Therefore, the current that flows into the gate of IGBT 43 becomes 0. As N-channel field-effect transistor 8 is turned on, a current flows out from the gate of IGBT 43 and the output voltage Vout from the driver circuit lowers to the ground potential.

Figure 5:
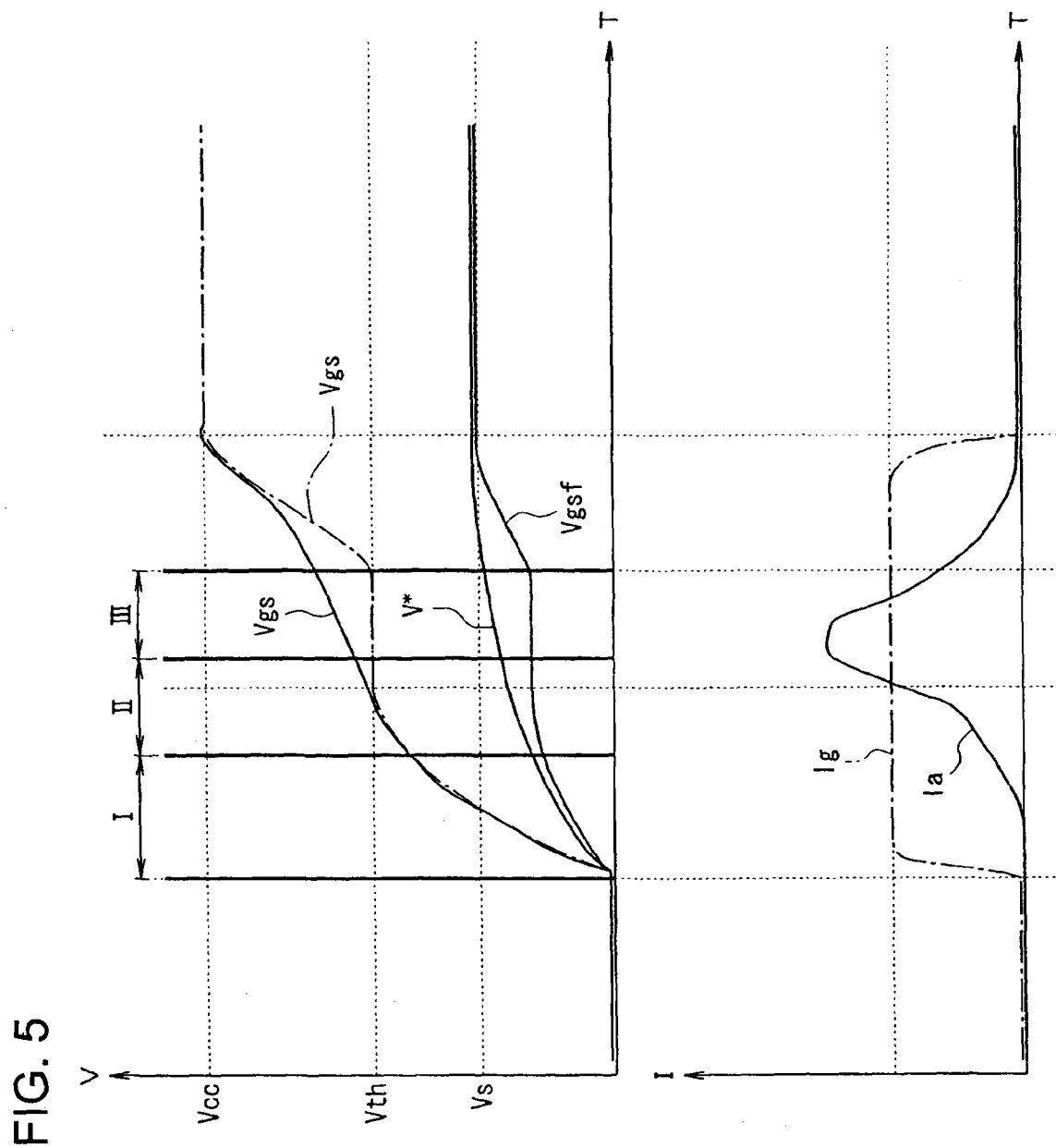
FIG. 5 is a wave chart describing the voltage waveforms and the current waveforms at the respective parts of the driver circuit shown in FIG. 4 in the turn-on thereof.
Figure 6:
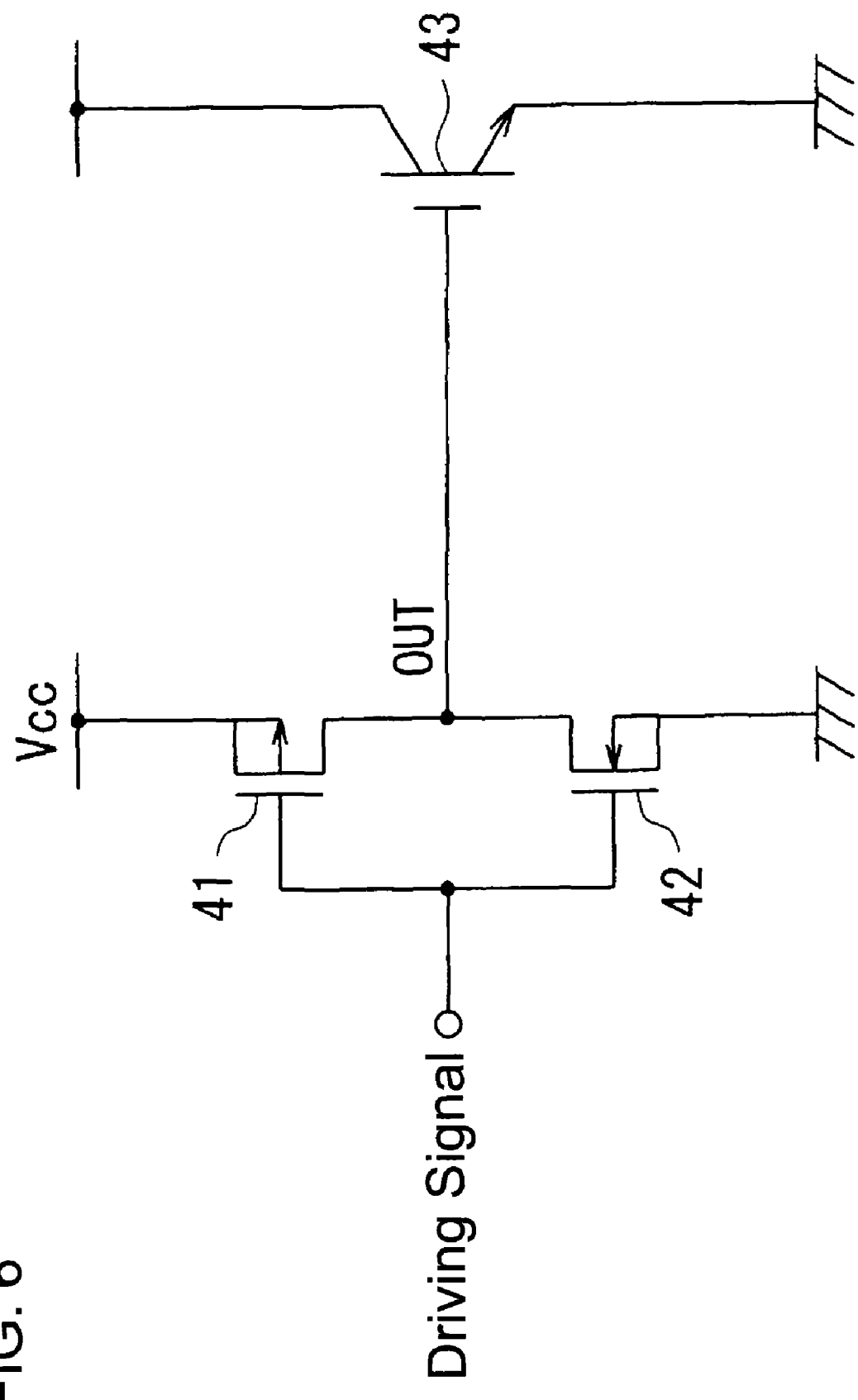
FIG. 6 is a circuit diagram briefly describing the structure of a conventional driver circuit.

FIG. 5 is a wave chart describing the voltage waveforms and the current waveforms at the respective parts of the driver circuit shown in FIG. 4 in the turn-on thereof. When the driver circuit shown in FIG. 1 is not disposed in the driver circuit shown in FIG. 4, only the constant current Ig flows into the gate of IGBT 43 in the turn-on. Due to this, the voltage Vgs between the gate and source of IGBT 43, which has risen in the early stage I of the turn-on, saturates in the middle and late stages II and III as described by a single-dotted chain curve in FIG. 5. Therefore, the driving capability is reduced in the late stage III.

When the driver circuit shown in FIG. 1 is disposed in the driver circuit shown in FIG. 4, not only the constant current Ig but also the current Ia proportional to the difference between the output voltage V* from slope setting circuit 13 and the divided voltage Vgsf, obtained by dividing the voltage Vgs with resistors 15 and 16, flow into the gate of IGBT 43 in the turn-on.

Due to the configuration described above, it is possible to further raise the voltage Vgs between the gate and source of IGBT 43, which has risen in the early stage I of the turn-on, without saturating even in the middle and late stages II and III as described by a solid curve in FIG. 5. Therefore, it is possible to raise the driving capability in the late stage III.

Even in driving IGBT 43, the gate capacitance thereof is large (when the driver output is 200 mA or higher), it is possible to control a large current, which flows into the gate of IGBT 43 in a short period of around 1 μs, at a high speed. Therefore, easy design of operational amplifier 14 is facilitated, the losses and noised of IGBT 43 are reduced, and the driving performances of the driver circuit are improved.

The first and second embodiments of the invention have been described in connection with slope setting circuit 13 shown in FIG. 1 that exponentially increases the setting value of the gate voltage waveform of IGBT 43. Alternatively, the driver circuit is provided with a first voltage waveform setting section, which exponentially increases the setting value of the gate voltage waveform of IGBT 43, and a second voltage waveform setting section, which linearly increases the setting value of the gate voltage waveform of IGBT 43. Any of the outputs from the first and second voltage waveform setting sections is selected and inputted to operational amplifier 14.

This application is based on, and claims priority to, Japanese Patent Application No: 2007-316186, filed on Dec. 6, 2007. The disclosure of the priority application, in its entirety, including the drawings, claims, and the specification thereof, is incorporated herein by reference.

What is claimed is:

1. A driver circuit comprising:
    a constant current supply generating a constant current;
    a changeover circuit connecting a gate of an insulated gate device in turn-on to a power supply potential side via the constant current supply and connecting the gate of the insulated gate device in turn-off to a ground potential side;
    a slope setting circuit setting a gate voltage waveform of the insulated gate device; and
    an operational amplifier driving the gate of the insulated gate device based on a difference between a detected value of a gate voltage of the insulated gate device and a set value of the gate voltage set in the slope setting circuit.

2. The driver circuit according to claim 1, wherein the changeover circuit connects the gate of the insulated gate device to a power supply potential side based on a trigger input; and wherein the slope setting circuit generates the gate voltage waveform of the insulated gate device based on the trigger input.

3. The driver circuit according to claim 2, wherein the constant current supply comprises:
a first transistor having a resistor connected to a drain side thereof;
a second transistor constituting a current mirror together with the first transistor, the second transistor generating the constant current determined by a resistance value of the resistor and a reference voltage; and
a third transistor constituting a current mirror together with the second transistor, the third transistor comprising a drain connected to the gate of the insulated gate device.

4. The driver circuit according to claim 3, wherein the driver circuit further comprises:
a fourth transistor connected in series to the second transistor; and
a fifth transistor switching the fourth transistor for making a current flow through the resistor.

5. The driver circuit according to claim 1, wherein the constant current supply comprises:
a first transistor having a resistor connected to a drain side thereof;
a second transistor constituting a current mirror together with the first transistor, the second transistor generating the constant current determined by a resistance value of the resistor and a reference voltage; and
a third transistor constituting a current mirror together with the second transistor, the third transistor comprising a drain connected to the gate of the insulated gate device.

6. The driver circuit according to claim 5, wherein the driver circuit further comprises:
a fourth transistor connected in series to the second transistor; and
a fifth transistor switching the fourth transistor for making a current flow through the resistor.

7. The driver circuit according to claim 1, wherein the driver circuit sets an upper limit value of an output voltage from the slope setting circuit based on a value proportional to a power supply voltage of the driver circuit.

8. The driver circuit according to claim 1, wherein a voltage in the gate voltage waveform set by the slope setting circuit increases exponentially.

9. The driver circuit according to claim 8, wherein the slope setting circuit comprises:
a constant current supply generating a constant current;
a current mirror circuit generating a current proportional to the current generated by the constant current supply;
a series circuit comprising a resistor and a capacitor, the series circuit being connected to an output terminal of the slope setting circuit; and
a switching device triggered by a trigger input for making the current generated by the current mirror circuit flow to the series circuit.

10. The driver circuit according to claim 1, wherein a voltage in the gate voltage waveform set by the slope setting circuit increases linearly.

11. The driver circuit according to claim 10, wherein the slope setting circuit comprises:
a constant current supply generating a constant current;
a current mirror circuit generating a current proportional to the current generated by the constant current supply;
a capacitor connected to an output terminal of the slope setting circuit; and
a switching device triggered by the trigger input for making the current generated by the current mirror circuit flow to the capacitor.

12. The driver circuit according to claim 1, wherein the slope setting circuit comprises:
a first voltage waveform setting section making a set value of the gate voltage waveform of the insulate gate device increase exponentially;
a second voltage waveform setting section making the set value of the gate voltage waveform of the insulate gate device increase linearly; and
a voltage waveform selecting section selectively outputting any of the gate voltage waveform set by the first voltage waveform setting section and the gate voltage waveform set by the second voltage waveform setting section.

13. A driver circuit comprising:
a slope setting circuit that sets a gate voltage waveform of an insulated gate device; and
an operational amplifier that drives a gate of the insulated gate device based on a difference between a detected value of a gate voltage of the insulated gate device and a set value of the gate voltage set in the slope setting circuit;
wherein a voltage in the gate voltage waveform set by the slope setting circuit increases exponentially; and
wherein the slope setting circuit comprises:
a constant current supply generating a constant current;
a current mirror circuit generating a current proportional to the current generated by the constant current supply;
a series circuit comprising a resistor and a capacitor, the series circuit being connected to an output terminal of the slope setting circuit; and
a switching device triggered by a trigger input for making the current generated by the current mirror circuit flow to the series circuit.

14. A driver circuit comprising:
a slope setting circuit that sets a gate voltage waveform of an insulated gate device; and
an operational amplifier that drives a gate of the insulated gate device based on a difference between a detected value of a gate voltage of the insulated gate device and a set value of the gate voltage set in the slope setting circuit;
wherein a voltage in the gate voltage waveform set by the slope setting circuit increases linearly; and
wherein the slope setting circuit comprises:
a constant current supply generating a constant current;
a current mirror circuit generating a current proportional to the current generated by the constant current supply;
a capacitor connected to an output terminal of the slope setting circuit; and
a switching device triggered by the trigger input for making the current generated by the current mirror circuit flow to the capacitor.

15. A driver circuit comprising:
a slope setting circuit that sets a gate voltage waveform of an insulated gate device; and
an operational amplifier that drives a gate of the insulated gate device based on a difference between a detected value of a gate voltage of the insulated gate device and a set value of the gate voltage set in the slope setting circuit;
wherein the slope setting circuit comprises:
a first voltage waveform setting section making a set value of the gate voltage waveform of the insulate gate device increase exponentially;

a second voltage waveform setting section making the set value of the gate voltage waveform of the insulate gate device increase linearly; and a voltage waveform selecting section selectively outputting any of the gate voltage waveform set by the first voltage waveform setting section and the gate voltage waveform set by the second voltage waveform setting section.

* * * * *